(12) United States Patent
Toyama et al.

(10) Patent No.: US 12,224,886 B2
(45) Date of Patent: Feb. 11, 2025

(54) ELECTRONIC CONTROL DEVICE

(71) Applicant: HITACHI ASTEMO, LTD., Hitachinaka (JP)

(72) Inventors: Masahiro Toyama, Tokyo (JP); Yuki Nakamura, Tokyo (JP); Yutaka Uematsu, Tokyo (JP); Masayoshi Takahashi, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 49 days.

(21) Appl. No.: 18/255,446

(22) PCT Filed: Aug. 31, 2021

(86) PCT No.: PCT/JP2021/032021
§ 371 (c)(1),
(2) Date: Jun. 1, 2023

(87) PCT Pub. No.: WO2022/123835
PCT Pub. Date: Jun. 16, 2022

(65) Prior Publication Data
US 2024/0031204 A1    Jan. 25, 2024

(30) Foreign Application Priority Data

Dec. 11, 2020    (JP) ................. 2020-206122

(51) Int. Cl.
*H04L 25/02*    (2006.01)
*H01F 17/00*    (2006.01)
*H01R 13/6471*    (2011.01)
*H05K 1/02*    (2006.01)

(52) U.S. Cl.
CPC ......... *H04L 25/0272* (2013.01); *H01F 17/00* (2013.01); *H01R 13/6471* (2013.01); *H05K 1/0233* (2013.01); *H01F 2017/0093* (2013.01)

(58) Field of Classification Search
CPC . H04L 25/0272; H04L 25/0298; H01F 17/00; H01F 2017/0093; H01R 13/6471; H05K 1/0233; H04B 3/30
(Continued)

(56) References Cited

U.S. PATENT DOCUMENTS 8,284,007 B1 * 10/2012 Langner ............ H04L 27/2647
                                                         379/406.01
2007/0101814 A1 * 5/2007 Campbell ............. G01H 11/08
                                                          73/514.32
(Continued)

FOREIGN PATENT DOCUMENTS

| JP | 2019-536300 A | 12/2019 |
| WO | WO-2016/208380 A1 | 12/2016 |
| WO | WO-2018/168282 A1 | 9/2018 |

OTHER PUBLICATIONS

International Search Report with English Translation and Written Opinion dated Nov. 22, 2021 in corresponding International Application No. PCT/JP2021/032021 (8 pages).

*Primary Examiner* — Emmanuel Bayard
(74) *Attorney, Agent, or Firm* — Foley & Lardner LLP

(57) ABSTRACT

An electronic control device includes: a circuit board configured to be provided in a frame and to have a communication circuit capable of receiving or transmitting differential signals via a pair of signal pins; a connector configured to be electrically connected to the circuit board and to input signals transmitted from an electronic device outside the frame by single-end transmission to the communication circuit; and a noise cancellation signal output circuit configured to output noise cancellation signals corresponding to noise superimposed on the signals in the connector, wherein one signal pin of the pair of signal pins of the communica- (Continued)

tion circuit is connected to the connector, and the other signal pin is connected to the noise cancellation signal output circuit.

7 Claims, 10 Drawing Sheets

(58) Field of Classification Search
USPC .................... 375/219–220, 257–258, 285
See application file for complete search history.

(56) References Cited

U.S. PATENT DOCUMENTS

| | | | |
|---|---|---|---|
| 2007/0241443 A1* | 10/2007 | Ong | H01L 23/50 257/E23.079 |
| 2008/0310521 A1* | 12/2008 | Otsuka | H04L 25/028 375/295 |
| 2010/0244898 A1* | 9/2010 | Van Den Brande | H03K 17/162 326/62 |
| 2010/0246647 A1* | 9/2010 | Maillard | H04L 25/0278 375/220 |
| 2010/0267283 A1* | 10/2010 | Pischl | H01R 13/6461 439/620.05 |
| 2011/0080973 A1* | 4/2011 | Ahmed | H04L 25/0274 375/259 |
| 2012/0007701 A1* | 1/2012 | Kaeriyama | H04L 5/16 333/24 R |
| 2015/0318599 A1* | 11/2015 | Ivanov | H01P 5/085 375/296 |
| 2017/0041044 A1* | 2/2017 | Ivanov | H04B 3/28 |
| 2019/0386630 A1 | 12/2019 | Higuchi et al. | |
| 2022/0262718 A1* | 8/2022 | Ong | H01L 21/485 |

* cited by examiner

ELECTRONIC CONTROL DEVICE

TECHNICAL FIELD

The present invention relates to an electronic control device.

BACKGROUND ART

In recent years, for driving support systems and automatic driving, there is an increasing trend of a system for connecting a sensor module represented by a camera and an electronic control device by a coaxial line and transmitting sensor data by high-speed signal transmission.

As signals are made to be high-speed, a decrease in resistance to external electromagnetic noise is one problem, and in particularly, there is a problem, that noise induced in a shield of a coaxial cable enters an electronic control device and is superimposed on a signal wiring, and signal transmission is inhibited.

PTL 1 discloses a means for suppressing radiation from a device and external common mode noise by inserting a common mode choke coil into a signal wiring in a signal transmission system using a coaxial line with an IC that transmits and receives differential signals.

CITATION LIST

Patent Literature

PTL 1: JP 2019-536300 A

SUMMARY OF INVENTION

Technical Problem

However, technology of PTL 1 functions in that the common mode noise of a differential wiring in a substrate is not output and the common mode noise from outside is not input to the differential wiring, but in a case where the noise transmitted through the shield of the coaxial line is superimposed as a voltage fluctuation between the signal wiring and the ground at a connector part, it is not possible to attenuate the noise. Therefore, there is a problem to be solved that noise resistance to external noise is low.

Solution to Problem

An electronic control device according to the present invention includes: a circuit board configured to be provided in a frame and to have a communication circuit capable of receiving or transmitting differential signals via a pair of signal pins; a connector configured to be electrically connected to the circuit board and to input signals transmitted from an electronic device outside the frame by single-end transmission to the communication circuit; and a noise cancellation signal output circuit configured to output noise cancellation signals corresponding to noise superimposed on the signals in the connector, wherein one signal pin of the pair of signal pins of the communication circuit is connected to the connector, and the other signal pin is connected to the noise cancellation signal output circuit.

Advantageous Effects of Invention

According to the present invention, the noise resistance to the external noise can be improved.

DESCRIPTION OF EMBODIMENTS

Hereinafter, preferred embodiments of the present invention will be described with reference to the drawings. Note that, in the following, a range necessary for description for achieving an object of the present invention will be schematically illustrated, a range necessary for description of a corresponding portion of the present invention will be mainly described, and portions for which description is omitted will be based on known techniques. In this example, normal mode noise is superimposed as a voltage variation between a signal line and the ground, and common mode noise is flowing through a shield of the coaxial cable. A mode conversion in a connector portion means that a part of the signal wiring is exposed from the shield at a substrate connection portion of the connector, and the common mode noise of the shield is transmitted to the signal wiring and flows through the signal wiring as the normal mode noise.

In each embodiment to be described below, in a case where signals from a signal generator (also referred to as a driver) are transmitted to a passive circuit provided on a substrate by a cable (a coaxial high-speed communication cable) with a connector covered with a shield frame, the common mode noise is conversed into the normal mode noise and superimposed on the signals. By generating signals for canceling the normal mode noise using a circuit configuration to be described in each embodiment, the noise superimposed on the signals is removed. This is because it is most effective to remove the noise at the stage before inputting reception signals to the circuit that demodulates the reception signals.

As a result, it is possible to improve the noise resistance without impairing signal quality of the signals transmitted through the cable, and to achieve both the noise resistance and the performance of coaxial high-speed communication. In addition, a low-cost connector can also be used.

Note that, in the following embodiments, the signal generator will be described as a vehicle-mounted camera. A cable of such a camera is for Gbps-class coaxial high-speed transmission and has low noise resistance. Therefore, it is difficult to ensure reliability of the signals for automatic driving. In addition, for an in-vehicle device, since there is a restriction on a shield structure that can be adopted around the connector from viewpoints of reliability and cost, it is difficult to remove the noise superimposed by mode conversion from outside in the connector portion, but this can be eliminated in each embodiment.

First Embodiment

Figure 1:
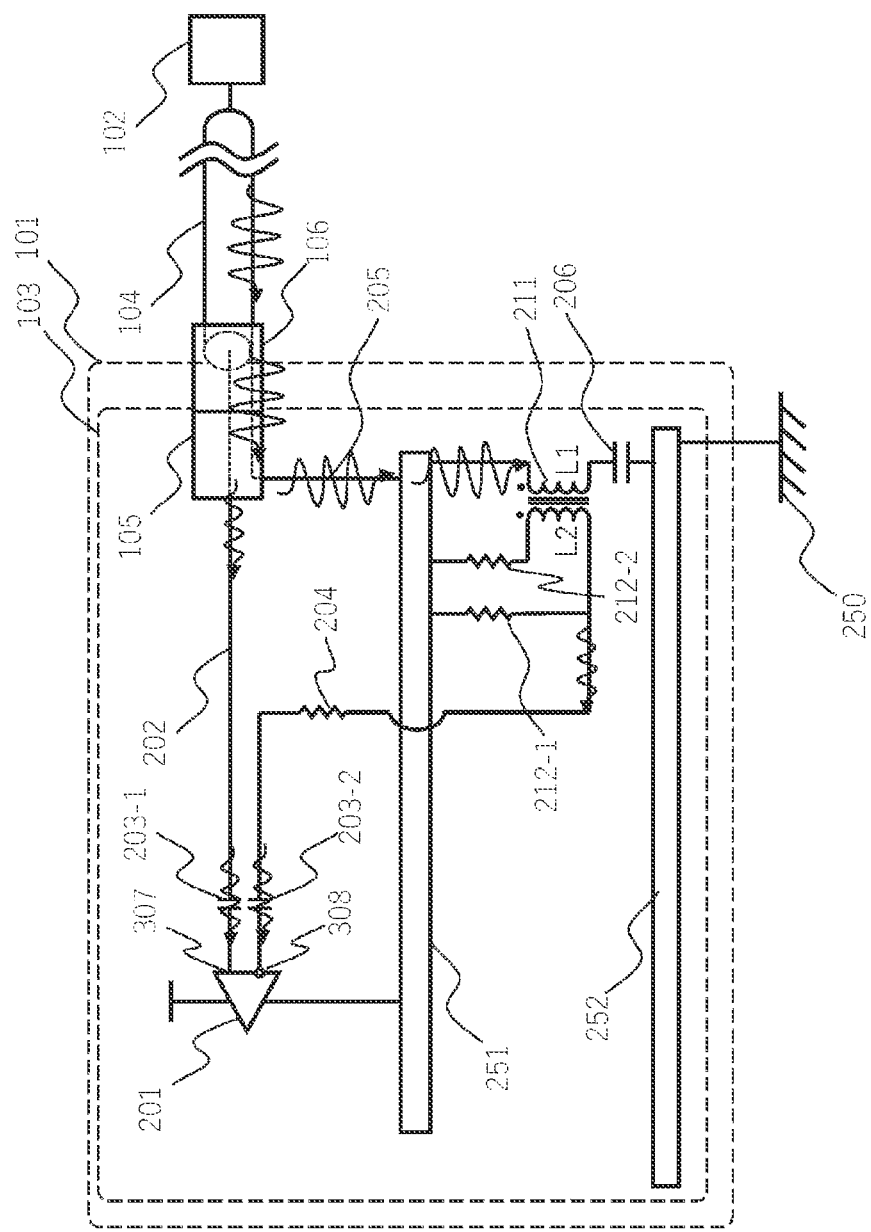
FIG. 1 is a circuit configuration diagram of an electronic control device according to a first embodiment.

FIG. 1 is a circuit configuration diagram of an electronic control device according to a first embodiment. In the summary of the electronic control device of the embodiment of FIG. 1, a primary side of a common mode choke is connected to a common mode noise path passing from a substrate GND (SG) to a frame GND (FG), and a secondary side is connected to n pins (unused) of a receiver via a resistor, so that a waveform (a noise-induced voltage) close to the noise superimposed on signals by the connector is generated, and this is input to the n pins of an unused differential receiver to cancel normal mode noise superimposed on signals by the connector.

As a result, the noise resistance can be improved without impairing the signal quality, and both the noise resistance and the performance of coaxial high-speed communication can be achieved. In addition, the low-cost connector can also be used.

Hereinafter, descriptions will be given in detail. As illustrated in FIG. 1, an electronic control device 101 is mounted on a vehicle and includes a circuit board 103.

The electronic control device 101 is connected to a connector 106 of a coaxial cable 104 connected to a camera 102 (also referred to as CCD: a sensor module).

Further, the cable-side coaxial connector 106 is coupled by a board-side coaxial connector 105 of the electronic control device 101.

The circuit board 103 includes a signal ground 251 (SG: a ground pattern) and a frame ground 252 (FG), and further includes a differential receiver 201 (a differential amplifier), coupling capacitors 203-1 and 203-2, a termination resistor 204, a common mode choke coil 211 (number of windings: 1:1), a frame ground connection capacitor 206, and adjustment resistors 212-1 and 212-2. The signal ground 251 (SG) is connected to the shield of the coaxial cable 104 via a connector ground connection 205, the board-side coaxial connector 105, and the cable-side coaxial connector 106.

The differential receiver 201 includes a signal input pin 307, an n pin 308 (an empty pin), and the like. The differential receiver 201 is a communication circuit capable of receiving differential signals via the pair of signal pins 307 and 308. The electronic control device 101 receives signals transmitted from the camera 102 by single-end transmission using one of signal pins 307 as a signal input pin.

A signal wiring (a core wiring) of the coaxial cable 104 coupled by the board-side coaxial connector 105 of the electronic control device 101 is connected to a signal wiring 202 on the board, and the signal wiring 202 is electrically connected to the signal input pin 307 of the differential receiver 201 via the coupling capacitor 203-1. As a result, the signals transmitted from the camera 102 by single-end transmission is input to the differential receiver 201 by the connector 105.

The coupling capacitor 203-2 is electrically connected to the termination resistor 204 and the n pin 308 (the empty pin).

One end of a primary coil L1 of the common mode choke coil 211 is connected to the signal ground 251 (SG), and one end of the frame ground connection capacitor 206 is connected to the other end of the primary coil L1. The other end of the frame ground connection capacitor 206 is connected to the frame ground 252 (FG). In other words, the primary coil L1 of the common mode choke coil 211 is connected between the signal ground 251 and the frame ground 252. The frame ground 252 (FG) is connected to a ground 250 which is a vehicle body of a vehicle on which the electronic control device 101 is mounted.

A secondary coil L2 of the common mode choke coil 211 has one end connected to the signal ground 251 via the adjustment resistor 212-2, and the other end connected to the adjustment resistor 212-1 and the termination resistor 204. The termination resistor 204 is connected to the n pin 308 of the differential receiver 201 via the coupling capacitor 203-2. In other words, the secondary coil L2 of the common mode choke coil 211 is connected to the n pin 308 of the differential receiver 201 via a voltage dividing resistor including the adjustment resistor 212-1 and the termination resistor 204.

Here, in the electronic control device 101 of the present embodiment, one of the pair of coils constituting the common mode choke coil 211 is used as the primary coil L1, and the other is used as the secondary coil L2. Note that, a general common mode choke coil is constituted by a pair of coils wound around a core, and has a structure similar to that of a transformer. Therefore, a transformer may be used instead of the common mode choke coil 211.

One end of the adjustment resistor 212-1 and one end of the adjustment resistor 212-2 are connected to the signal ground 251 (SG), respectively. The other end of the adjustment resistor 212-1 is connected to one end of the secondary coil L2 of the common mode choke coil 211, and the other end of the adjustment resistor 212-2 is connected to the other end of the secondary coil L2 of the common mode choke coil 211.

Note that, a resistance value of the adjustment resistor 212-2 and a resistance value of the voltage dividing resistor including the adjustment resistor 212-1 and the termination resistor 204 are preferably selected at the time of product development in accordance with a mode conversion amount (noise frequency, voltage, and current) in the connector portion to be described later. In other words, according to a transmission coefficient of the mode conversion in the connector, a resistance value at which an amplitude of the waveform input to the n pin 308 side of the differential receiver 201 is substantially equal to an amplitude of a noise waveform superimposed on the signal wiring and can be canceled out is determined by simulation or an actual machine, and the resistance value of each resistor is adjusted in accordance therewith.

Description of Operations of First Embodiment

Figure 2:
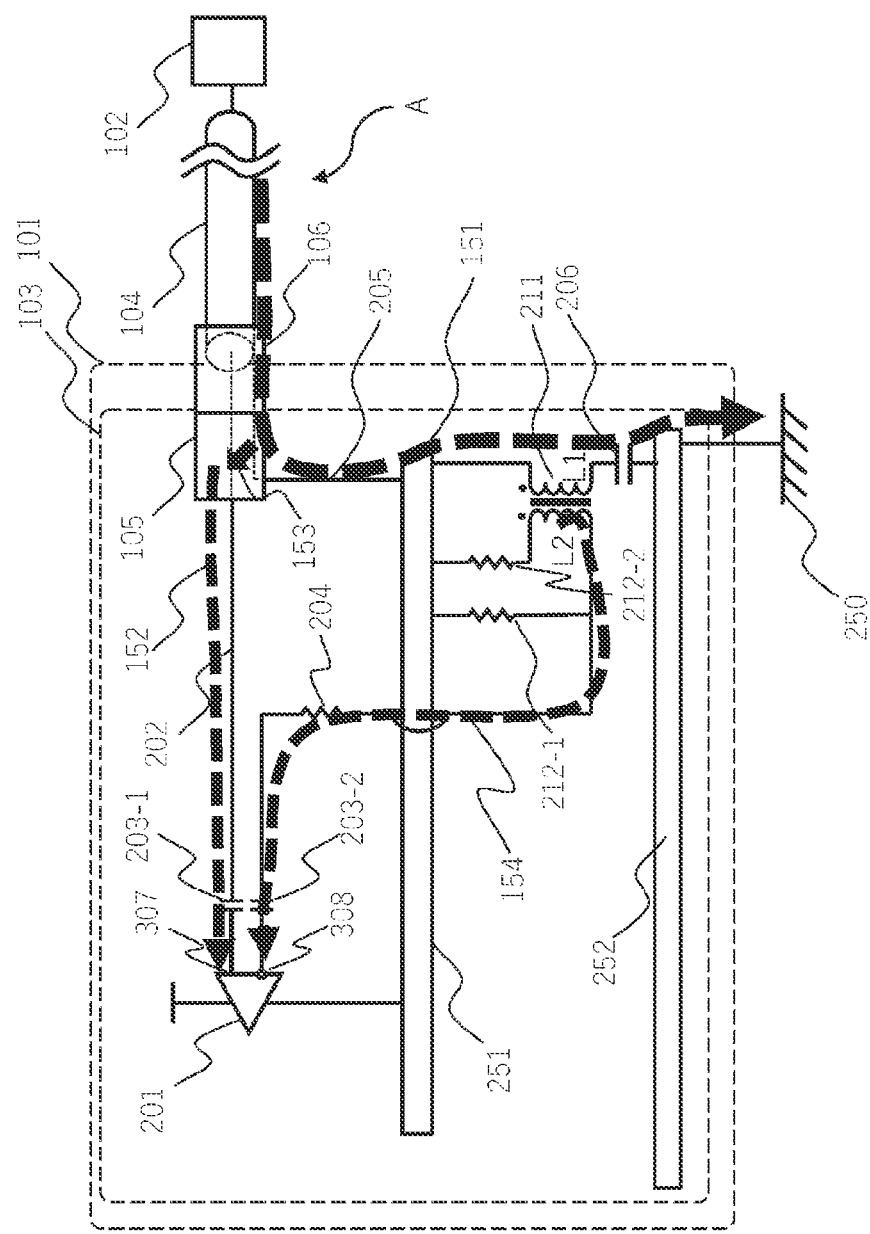
FIG. 2 is an explanatory diagram for explaining a flow of noise according to the first embodiment.

The operations of the device configured as described above will be described with reference to FIG. 2. FIG. 2 is an explanatory diagram for explaining a flow of noise according to the first embodiment. In FIG. 2, a part of the external common mode noise is superimposed on the signal wiring 202 as the normal mode noise by a mode conversion 153 in the connector 105, and is input to the signal input pin 307 of the differential receiver 201 together with the reception signals, which is similar to a conventional configuration. In the electronic control device 101 of the present embodiment, a waveform substantially equal to the normal mode noise generated in the mode conversion 153 is generated by the common mode choke coil 211 and the adjustment resistors 212-1 and 212-2 inserted in a common mode noise path 151, and reaches the n pin 308 of the differential receiver 201 in a path 154. As a result, the noise superimposed on the signal by the mode conversion 153 in the connector can be cancelled in the differential receiver 201, and the noise resistance can be improved. Since a delay due to a path difference can be ignored up to a certain frequency, the noise waveform superimposed on the signal wiring input to the signal input pin 307 and the waveform input to the n pin 308 can be regarded as the same phase, and can be canceled by the differential receiver 201.

As illustrated in FIG. 2, when external noise A occurs outside the electronic control device 101, the external noise A flows into the shield wiring of the coaxial cable 104, the cable-side connector 106, the board-side coaxial connector 105, and the like (the common mode noise). Since the core wiring of the coaxial cable 104 is covered with the shield wiring, a level at which the external noise A is directly superimposed on the core wiring that is a signal wire in the coaxial cable 104 is low. On the other hand, due to the mode conversion 153 described above, the external noise A is superimposed on the signal wiring 202 in the connector 105, and the normal mode noise occurs.

The common mode noise flowing into the electronic control device 101 from the coaxial cable 104 through the connectors 106 and 105 passes through the path 151 passing through the connector ground connection 205, the signal ground 251 (SG), the primary side L1 of the common mode choke coil 211, the frame ground connection capacitor 206, and the frame ground 252 (FG), and then passes through to the ground 250.

As the common mode noise flows through the path 151, a voltage (noise-induced voltage) corresponding to the common mode noise is induced on the secondary side L2 of the common mode choke coil 211.

The noise-induced voltage generates a current flowing into the n pin 308 of the differential receiver 201 through the path 154 passing through the signal ground 251 (SG), the adjustment resistor 212-2, the secondary side L2 of the common mode choke coil 211, the termination resistor 204 (also referred to as an output resistor), and the coupling capacitor 203-2.

On the other hand, the current due to the noise-induced voltage is also shunted to the adjustment resistor 212-1, and is input to the n pin 308 of the differential receiver 201 via the termination resistor 204 (also referred to as the output resistor) and the coupling capacitor 203-2.

At this time, since one of the adjustment resistors 212-2 is connected to the signal ground 251 (SG), the noise-induced voltage is applied to a series circuit including the adjustment resistor 212-2 and the secondary side L2 of the common mode choke coil 211.

In addition, since one of the adjustment resistors 212-1 is connected to the signal ground 251 (SG), the noise-induced voltage is also applied to the adjustment resistor 212-1.

Therefore, when the external common mode noise is input to the electronic control device 101 via the shield frame of the connector 105, the normal mode noise is superimposed on the signals transmitted through the signal wiring 202 by the mode conversion 153, and even if the external common mode noise is input to the input pin 307 of the differential receiver 201 via the coupling capacitor 203-1, the noise-induced voltage having the same frequency at the same level as the normal mode noise is input to the n pin 308 of the differential receiver 201 via the coupling capacitor 203-2. As a result, since the normal mode noise is canceled by a differential operation of the differential receiver 201, influence of the external common mode noise is removed. Note that, at this time, the common mode choke coil 211 functions as a noise cancellation signal output circuit that outputs noise cancellation signals for canceling the normal mode noise by outputting the noise-induced voltage as described above.

Therefore, it is possible to achieve both the noise resistance and the performance of coaxial high-speed communication without impairing the signal quality from the camera 102. In addition, it is possible to adopt a less expensive connector in which a sheet metal structure having many gaps is adopted as the shield structure.

This circuit is formed only of a passive element, and has a reduction effect on not only steady noise such as an immunity evaluation test but also intermittent noise that is likely to occur with electrification of an automobile. In addition, since a filter for common mode noise removal or the like is not inserted into the signal wiring 202 or the signal ground 251, there is no increase in signal loss, so that it is possible to maintain a transmittable distance at the same time.

Figure 3:
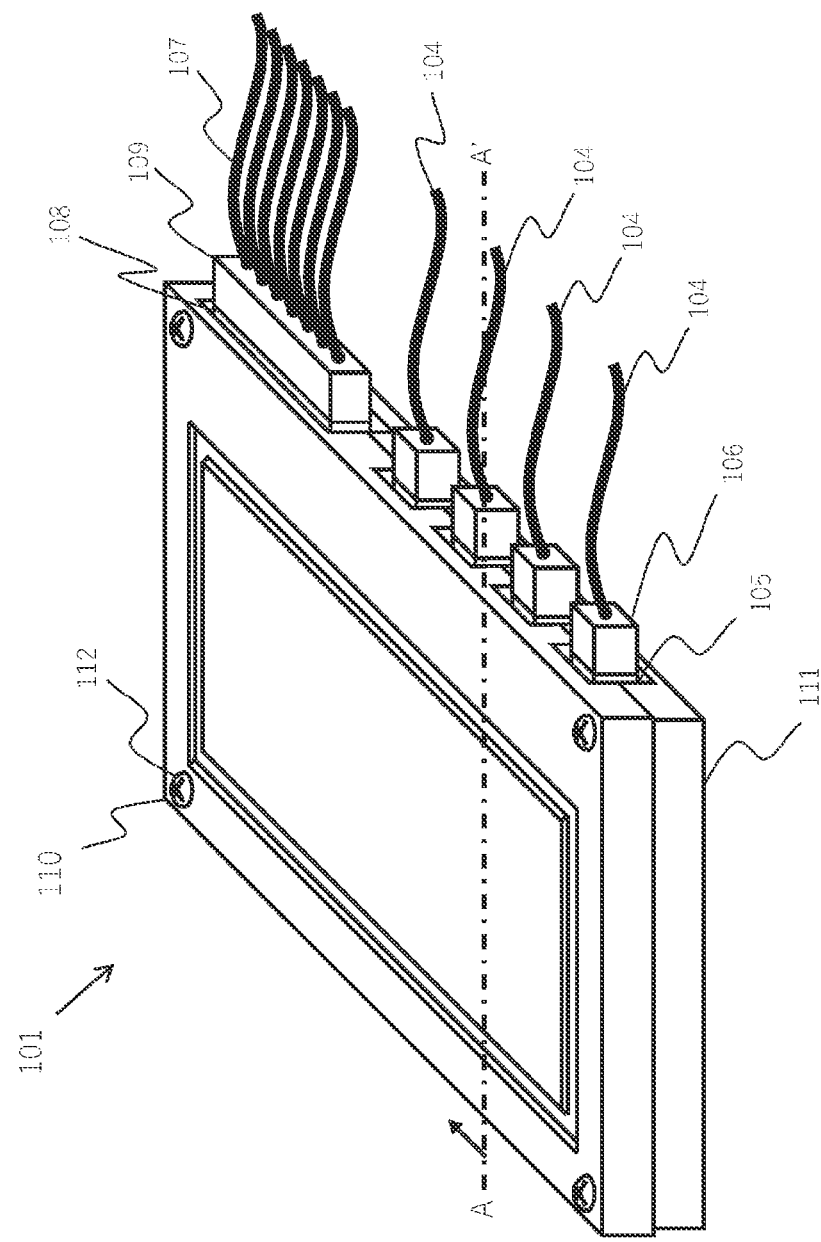
FIG. 3 is a perspective view illustrating an external appearance of the electronic control device according to the first embodiment.

FIG. 3 is an external perspective view of the electronic control device 101 of the present first embodiment, and the circuit board 103 of FIG. 1 is surrounded by a metal frame 111 and a cover 110. The metal frame 111 and the cover 110 are fixed by screws 112. As a result, the metal frame 111 and the cover 110 function as a frame that houses the circuit board 103.

In addition, the board-side coaxial connector 105 described in FIG. 1 is installed on the side surfaces of the metal frame 111 and the cover 110, and is connected to the cable-side connector 106 of the coaxial cable 104. Furthermore, the electronic control device 101 includes a non-coaxial board-side connector 108, and is electrically connected to a non-coaxial cable 107 by coupling the non-coaxial board-side connector 108 and a non-coaxial cable-side connector 109.

Figure 4:
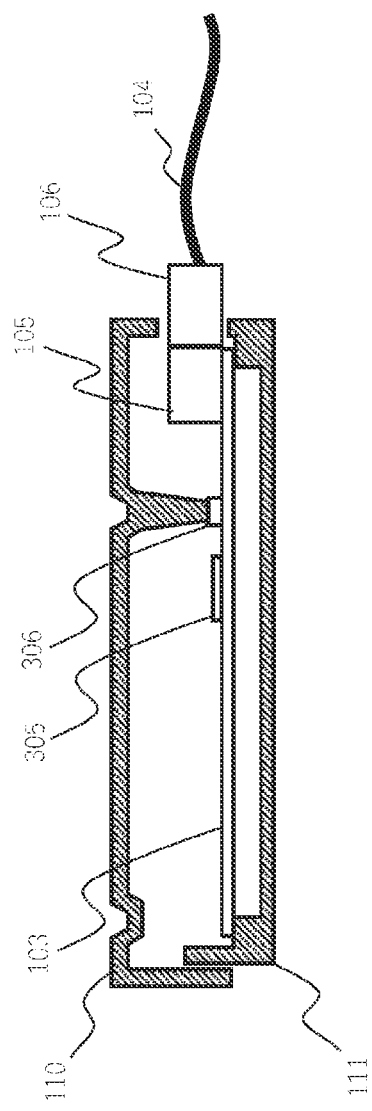
FIG. 4 is a cross-sectional view taken along a line A-A' of FIG. 3.

Note that, description of circuit components other than these connectors is omitted. FIG. 4 is a cross-sectional view taken along the line A-A' of FIG. 3.

As illustrated in FIG. 4, an IC 305 to be described later and a conductive EMI gasket 306 are provided on the circuit board 103. The EMI gasket 306 is electrically connected to the frame ground 252 in FIG. 1, and is pressed by the convex portion on an inner side of the cover 110. As a result, the frame ground 252 is electrically connected to the vehicle body (the ground 250 in FIG. 1) of the vehicle on which the electronic control device 101 is mounted via the EMI gasket 306 and the cover 110.

Figure 5:
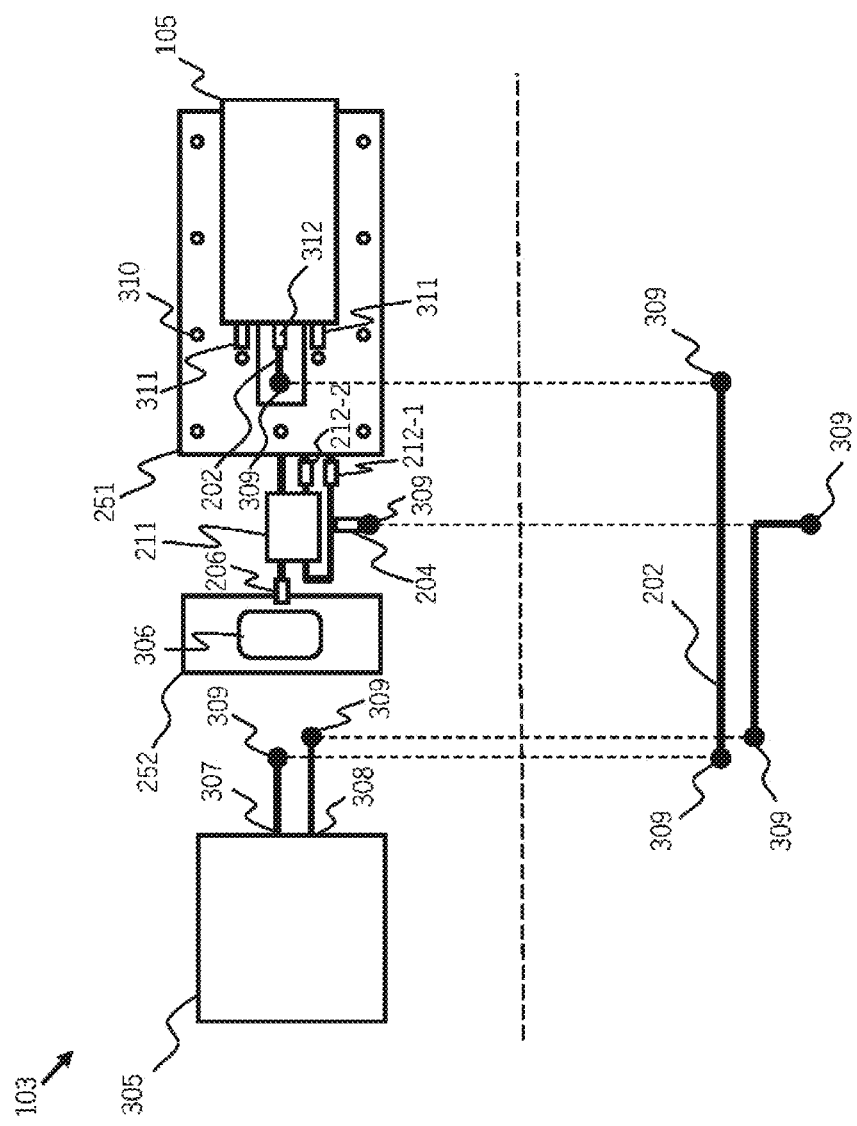
FIG. 5 is a diagram illustrating an external appearance of a circuit board according to the first embodiment.

Hereinafter, a case where a pattern is generated on a substrate to constitute the circuit board 103 of FIG. 1 will be described with reference to FIG. 5. FIG. 5 is a diagram illustrating an external appearance of the circuit board 103 according to the present first embodiment.

In FIG. 5, an upper diagram is a top view of the circuit board 103 of the present first embodiment, and a lower diagram is a diagram illustrating a wiring pattern on a back side of the circuit board 103.

As illustrated in FIG. 5, the pins of the board-side coaxial connector 105 include a signal pin 312 and connector ground pins 311 on both sides.

A pattern of the signal ground 251 having a large area is formed on the circuit board 103. The connector ground pins 311 on both sides of the board-side coaxial connector 105 are connected to the pattern of the signal ground 251 through via holes 310.

The signal pin 312 of the board-side coaxial connector 105 are connected to the signal wiring 202. The signal wiring 202 is connected to a wiring via hole 309. The signal wiring 202 and the wiring via hole 309 are surrounded by the signal ground 251.

The signal wiring 202 is connected to a pattern formed on the back side of the circuit board 103 via the wiring via hole 309. The pattern of the signal wiring 202 is electrically connected to the signal input pin 307 of the differential receiver 201 built in the IC 305 via another wiring via hole 309. Note that, the pattern of the signal wiring 202 may be formed not on the back side of the circuit board 103 but on an inner layer.

In addition, one end of the primary coil L1 of the common mode choke coil 211 is connected to the signal ground 251, and one end of the adjustment resistor 212-1 and one end of the adjustment resistor 212-2 are connected in common.

Further, the pattern of the frame ground 252 is formed at a subsequent stage of the common mode choke coil 211.

The frame ground connection capacitor 206 is connected between the pattern of the frame ground 252 and the other end of the primary coil L1 of the common mode choke coil 211. The EMI gasket 306 is disposed on the pattern of the frame ground 252, and the frame ground 252 is electrically connected to the ground 250 via the EMI gasket 306 as described above.

Further, the secondary coil L2 of the common mode choke coil 211 is connected to the wiring via hole 309 via the termination resistor 204, and is connected to the pattern formed on the back side of the circuit board 103 via the wiring via hole 309. This pattern is electrically connected to the n pin 308 of the differential receiver 201 built in the IC 305 via another wiring via hole 309. Note that, similarly to the pattern of the signal wiring 202, this pattern may be formed not on the back side of the circuit board 103 but on the inner layer.

According to the first embodiment described above, operational effects below are obtained.

(1) The electronic control device 101 includes the circuit board 103 that is provided in a frame (a metal frame 111 and a cover 110) and includes the differential receiver 201 that is a communication circuit capable of receiving differential signals via the pair of signal pins 307 and 308, the board-side coaxial connector 105 that is electrically connected to the circuit board 103 and inputs, to the differential receiver 201, the signals transmitted by single-end transmission from an electronic device (the camera 102) outside the frame, and a noise cancellation signal output circuit that outputs the noise cancellation signals corresponding to the noise superimposed on signals in the board-side coaxial connector 105, that is, a common mode choke coil 211. One signal pin 307 of the pair of signal pins 307 and 308 of the differential receiver 201 is connected to the board-side coaxial connector 105, and the other signal pin 308 is connected to the common mode choke coil 211. With this configuration, the noise superimposed on the signal wiring 202 by the mode conversion of the board-side coaxial connector 105 can be cancelled by the differential receiver 201. Therefore, the noise resistance to the external noise can be improved.

(2) The noise cancellation signal output circuit includes the common mode choke coil 211 or a transformer. The primary side of the common mode choke coil 211 or the transformer is connected between the signal ground 251 connected to the board-side coaxial connector 105 and the frame ground 252 connected to the frame, and the secondary side of the common mode choke coil 211 or the transformer is connected to the other signal pin 308 of the differential receiver 201. With this configuration, the noise cancellation signal corresponding to the noise superimposed on the signal wiring 202 can be easily generated using the common mode choke coil or the transformer, and can be input to the signal pin 308 of the differential receiver 201.

(3) The secondary side of the common mode choke coil 211 or the transformer is connected to the other signal pin 308 of the differential receiver 201 via the voltage dividing resistor including the adjustment resistor 212-1 and the termination resistor 204. The resistance value of the voltage dividing resistor is adjusted such that the voltage of the noise cancellation signal input to the other signal pin 308 cancels the above noise. With this configuration, the noise cancellation signal capable of canceling the noise superimposed on the signal wiring 202 can be reliably input to the signal pin 308 of the differential receiver 201.

Second Embodiment

Figure 6:
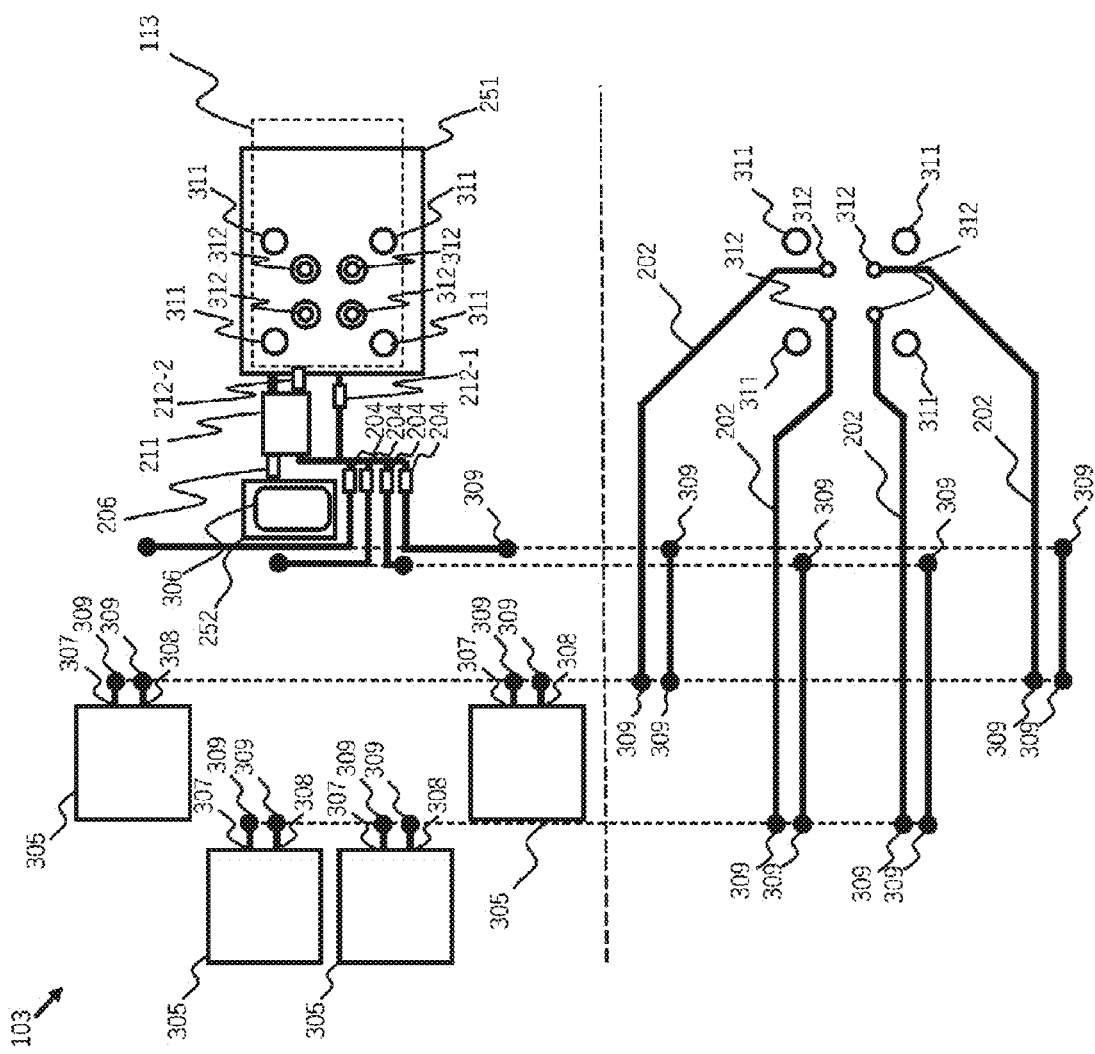
FIG. 6 is a diagram illustrating an external appearance of a circuit board according to a second embodiment.

Next, a second embodiment will be described with reference to FIG. 6. FIG. 6 is a diagram illustrating an external appearance of the circuit board 103 according to the present second embodiment. In FIG. 6, the upper diagram is a top view of the circuit board 103 in the electronic control device of the present second embodiment, and the lower diagram is a diagram illustrating a wiring pattern on the back side of the circuit board 103. For a point not shown here, the structure is similar to that of the first embodiment.

In the circuit board 103 of the present embodiment, a difference from the first embodiment is that a 4-pin connector 113 in which four coaxial cables can be connected by one connector is used, and the size of the connector part is reduced. The connector 113 includes four signal pins 312 and four connector ground pins 311 corresponding to the coaxial cables. In addition, the circuit board 103 of the present embodiment includes four ICs 305 each incorporating the differential receiver 201 corresponding to the four signal pins 312 of the connector 113. Note that, although the example in which the four coaxial cables are commonly connected to the connector 113 has been described in the present embodiment, the number of coaxial cables commonly connected to the connector 113 is not limited thereto, and may be any number.

In this case, since the external noise induced in any of the coaxial lines escapes to the signal ground 251 via a ground portion provided as a common structure in the connector 113, the noise is superimposed on any of the signal pins 312 to the same extent. Therefore, the common mode choke coil 211 and the adjustment resistors 212-1 and 212-2 can be shared and arranged for each coaxial cable.

As a result, this makes it possible to save the amount of components and the area on the board. In other words, as illustrated in FIG. 6, each signal pin 312 of the connector 113 is electrically connected to the corresponding signal input pin 307 of the differential receiver 201 built in each IC 305 via the signal wiring 202 formed on the back side or the inner layer of the circuit board 103. In addition, each connector ground pin 311 of the connector 113 is connected to a pattern of the signal ground 251 formed around the connector 113.

Further, as illustrated in FIG. 6, the termination resistors 204 are provided corresponding to each IC 305, one end of each termination resistor 204 is commonly connected to the secondary coil L2 of the common mode choke coil 211, and the other end of each termination resistor 204 is connected to the n pin 308 of the differential receiver 201 built in the corresponding IC 305. In other words, the n pin 308 of the differential receiver 201 of each IC 305 is commonly connected to the common mode choke coil 211 via the termination resistor 204.

According to the second embodiment described above, the circuit board 103 includes the plurality of differential receivers 201, and the connector 113 includes the plurality of signal pins 312. The plurality of signal pins 312 are respectively connected to one signal pin 307 of the different differential receivers 201, and the other signal pin 308 of the plurality of differential receivers 201 is commonly connected to the common mode choke coil 211 which is a noise cancellation signal output circuit. With this configuration, in the electronic control device capable of commonly connecting the plurality of coaxial cables, it is possible to suppress the number of components and a board area while improving noise resistance against external noise.

Third Embodiment

Figure 7:
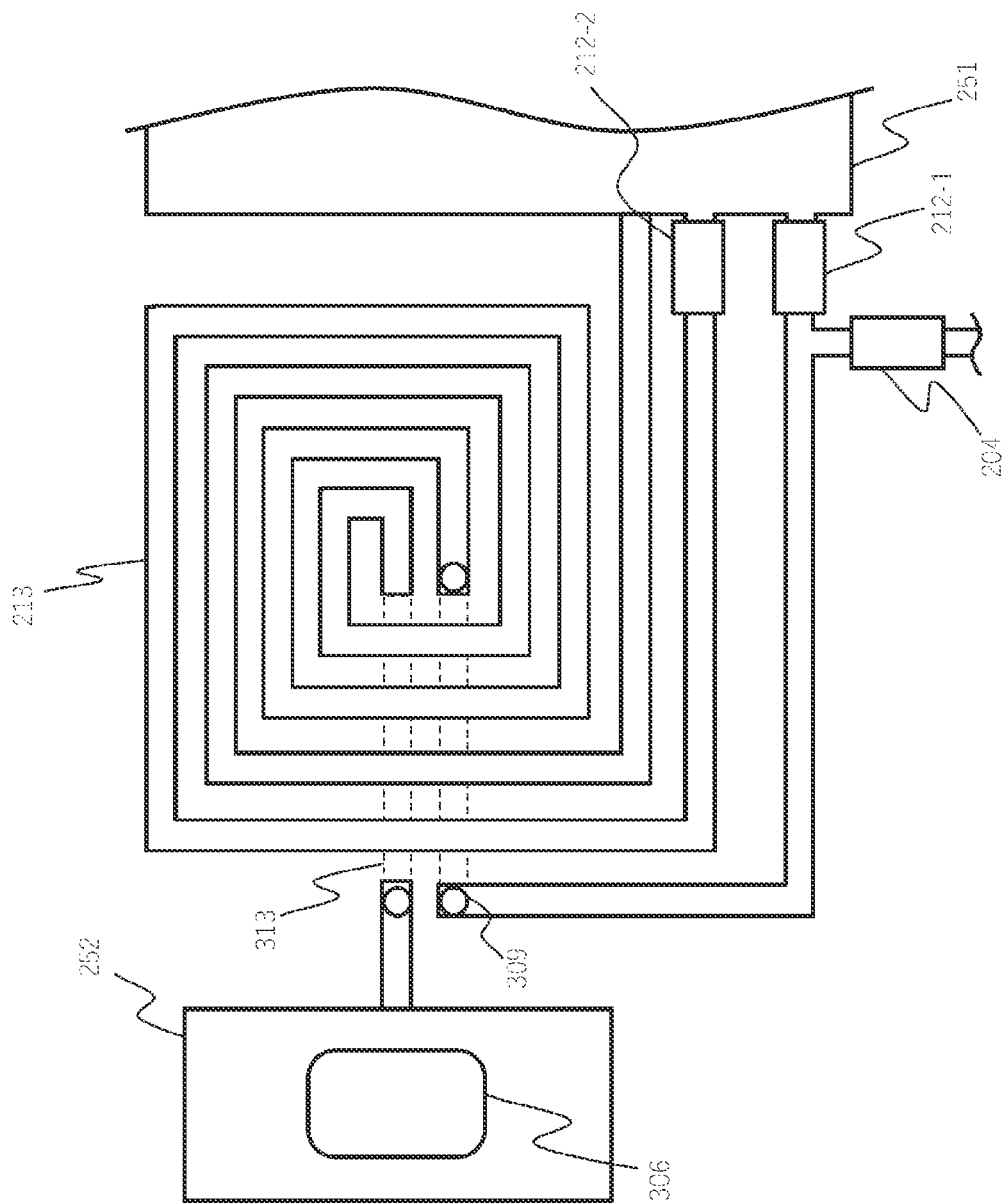
FIG. 7 is a diagram illustrating a substrate pattern of a noise cancellation signal output circuit according to a third embodiment.

Next, a third embodiment of the present invention will be described with reference to FIG. 7. FIG. 7 illustrates a board pattern of the noise cancellation signal output circuit in the electronic control device according to the present third embodiment. For a point not shown here, the structure is similar to that of the first embodiment. A difference between the present third embodiment and the embodiment above is that the noise cancellation signal output circuit is realized by a wiring pattern on a substrate instead of a discrete component such as a common mode choke coil or a transformer.

In the present third embodiment, as illustrated in FIG. 7, a transformer 213 is configured by a spiral wiring pattern formed on a substrate. By using the transformer 213 as a noise cancellation signal output circuit instead of the common mode choke coil 211 in the first embodiment, an electronic control device having a circuit configuration as illustrated in FIG. 1 is configured. Note that, the structure illustrated here is an example, and the number of turns and the wiring arrangement may have other shapes.

According to the third embodiment described above, the transformer 213 is configured by the wiring pattern on the substrate. With this configuration, component costs can be reduced.

Fourth Embodiment

Figure 8:
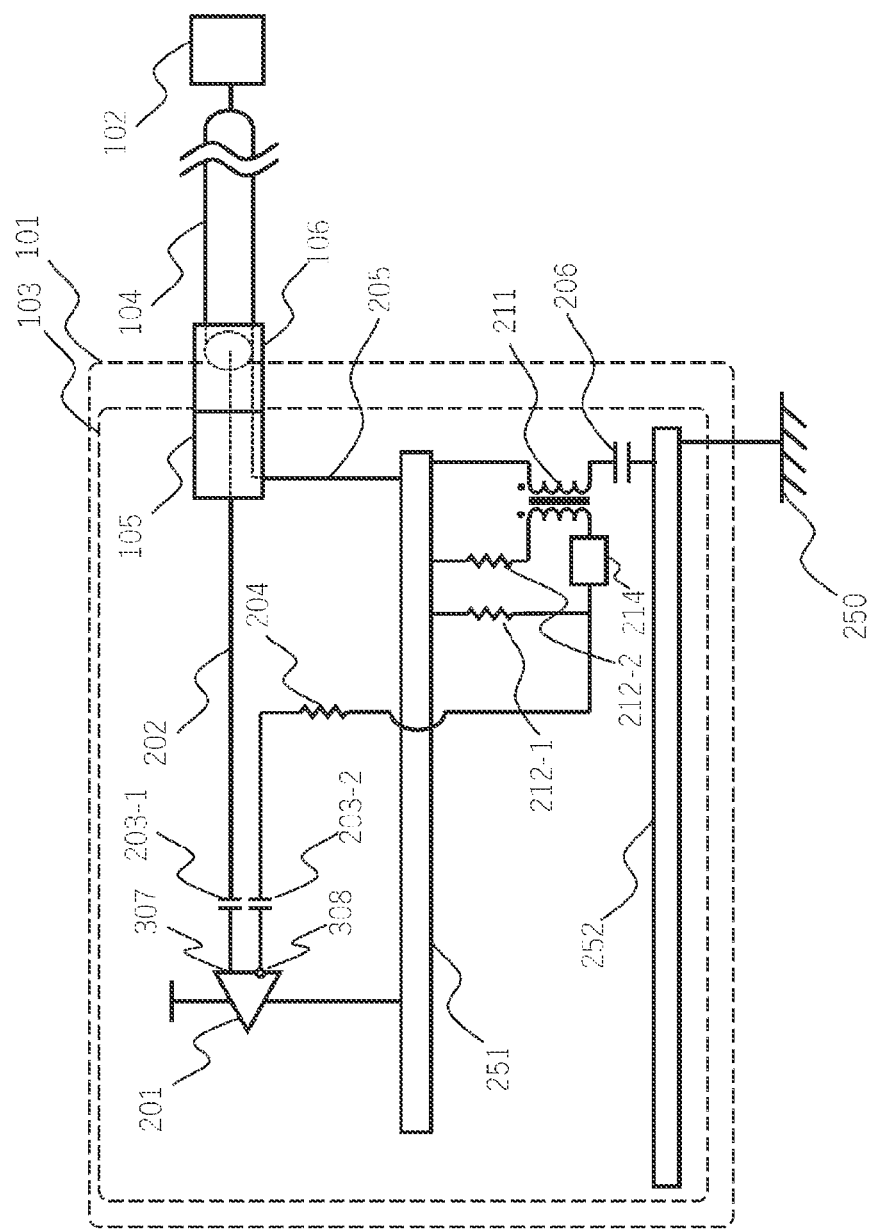
FIG. 8 is a circuit configuration diagram of an electronic control device according to a fourth embodiment.

Next, a fourth embodiment of the present invention will be described with reference to FIG. 8. FIG. 8 is a circuit configuration diagram of an electronic control device according to the present fourth embodiment. For a point not shown here, the structure is similar to that of the first embodiment. A difference between the present fourth embodiment and the first embodiment is that a low pass filter 214 is inserted on the secondary coil L2 side of the common mode choke coil 211, and a noise cancellation signal output circuit is configured including the low pass filter 214.

In addition, in the present fourth embodiment, the low pass filter 214 is inserted between the common mode choke coil 211 and the adjustment resistor 212-1, but it may be inserted in another place where the same effect can be obtained. In addition, the low pass filter 214 is preferably formed of an LC filter, a ferrite bead, or the like.

In the first embodiment, in a case where a corresponding frequency of the noise cancellation signal output circuit using the common mode choke coil 211 and the resistor is insufficient, or due to a difference in wiring length between the wiring to the differential receiver 201 and the signal wiring 202, the noises on a radio frequency side cannot be sufficiently canceled out, and conversely, there is a possibility that adverse effects are exerted.

Therefore, as in the present fourth embodiment, the low pass filter 214 is inserted on the secondary coil L2 side of the common mode choke coil 211, and the noise-induced voltage output from the common mode choke coil 211 is caused to act only on the noise within the corresponding frequency, so that the noise resistance can be improved while avoiding this problem.

According to the fourth embodiment described above, the noise cancellation signal output circuit includes the low pass filter 214. With this configuration, it is possible to improve the noise resistance while suppressing the adverse effects of the noise-induced voltage output from the noise cancellation signal output circuit in a radio frequency range.

Fifth Embodiment

Figure 9:
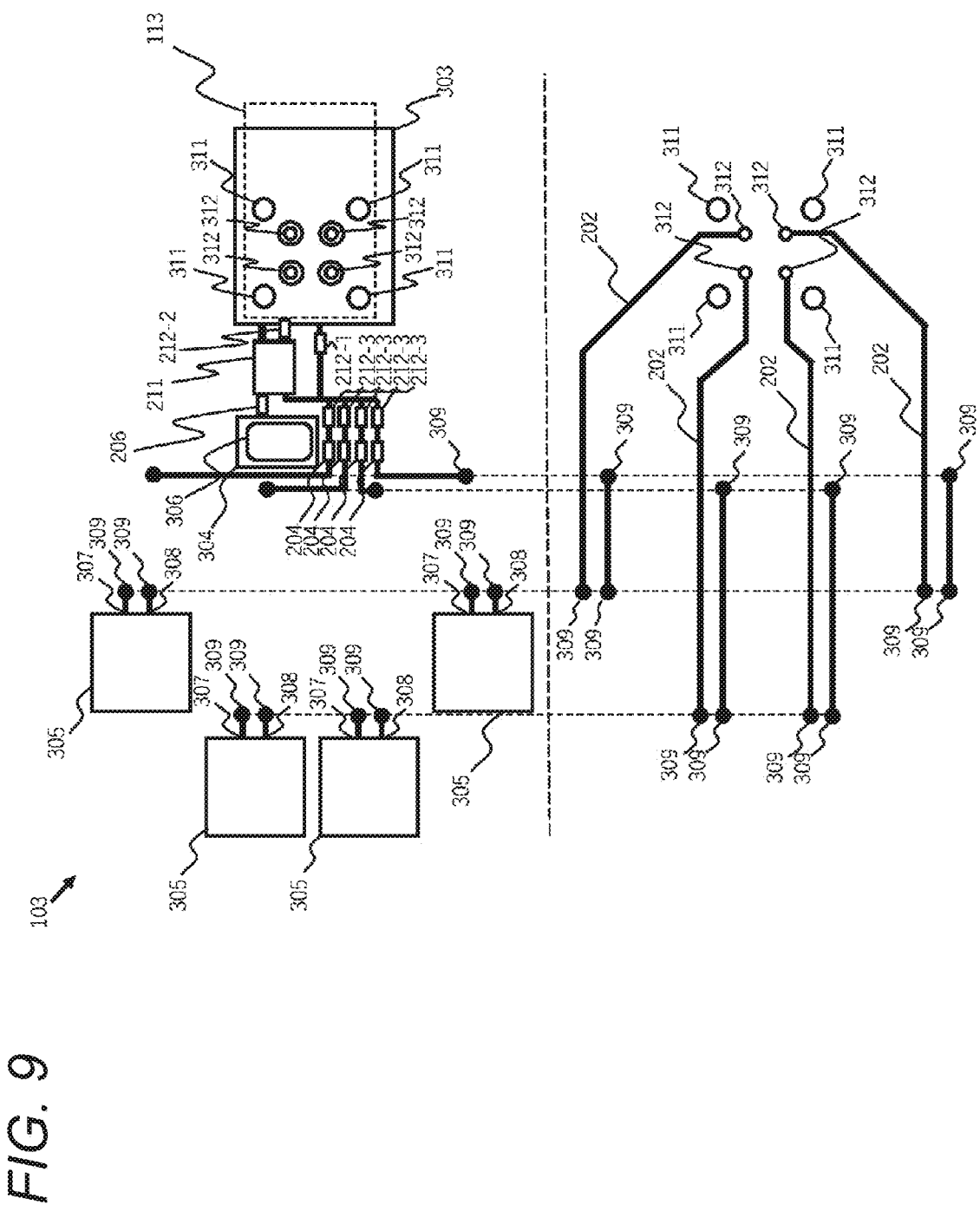
FIG. 9 is a diagram illustrating an external appearance of a circuit board according to an electronic control device of a fifth embodiment.

A fifth embodiment will be described with reference to FIG. 9. FIG. 9 illustrates an external appearance of the circuit board 103 according to the present fifth embodiment. For a point not shown here, the structure is similar to that of the second embodiment.

A difference between the present fifth embodiment and the second embodiment is that an adjustment resistor 212-3 is inserted in series into each termination resistor 204.

In the present fifth embodiment, in a case where there is a difference in superimposed noise with respect to each signal pin 312 in the 4-pin connector 113, this is eliminated. In other words, by adjusting the resistance value of each adjustment resistor 212-3 in accordance with the difference in the amount of superimposed noise to each signal wiring 202, the difference in the amount of noise for each signal pin 312 can be absorbed.

In the present fifth embodiment, as illustrated in FIG. 9, in the circuit board 103, each signal pin 312 of the connector 113 is electrically connected to the corresponding signal input pin 307 of the differential receiver 201 built in each IC 305 via the signal wiring 202 formed on the back side or the inner layer of the circuit board 103. In addition, each connector ground pin 311 of the connector 113 is connected to a pattern of the signal ground 251 formed around the connector 113.

Further, as illustrated in FIG. 9, a series circuit including the adjustment resistor 212-3 and the termination resistor 204 is provided corresponding to each IC 305, one end of each series circuit is commonly connected to the secondary coil L2 of the common mode choke coil 211, and the other end of each series circuit is connected to the n pin 308 of the differential receiver 201 built in the corresponding IC 305. In other words, adjustment resistors 212-3 are respectively inserted between the common mode choke coil 211 and the n pin 308 of the differential receiver 201 of each IC 305 in addition to the termination resistor 204.

According to the fifth embodiment described above, the adjustment resistors 212-3 are respectively inserted between the common mode choke coil 211, which is a noise cancellation signal output circuit, and the n pin 308 of the differential receiver 201 of each IC 305. With this configuration, in the electronic control device capable of commonly connecting the plurality of coaxial cables, it is possible to suppress a difference in the amount of noise superimposed on the signal of each coaxial cable and to equalize the signal quality.

Sixth Embodiment

Figure 10:
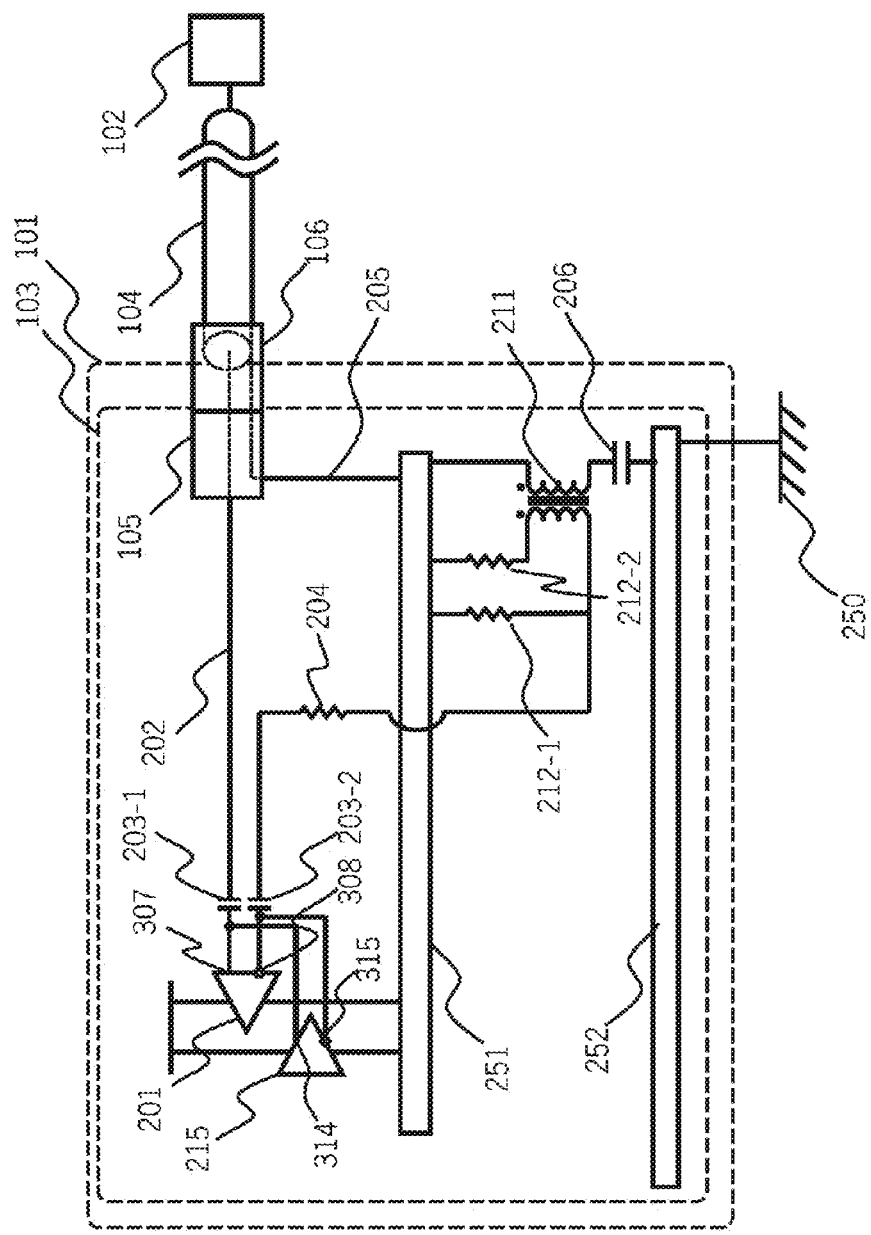
FIG. 10 is a circuit configuration diagram of an electronic control device according to a sixth embodiment.

A sixth embodiment will be described with reference to FIG. 10. FIG. 10 is a circuit configuration diagram of the electronic control device 101 according to the present sixth embodiment. For a point not shown here, the structure is similar to that of the first embodiment.

A difference between the first embodiment and the present sixth embodiment is that the differential transmitter 215 is disposed in parallel with the differential receiver 201 to enable a bidirectional communication. In other words, in the electronic control device 101 of the present sixth embodiment, the circuit board 103 includes a communication circuit capable of receiving and transmitting the differential signals by including the differential receiver 201 and the differential transmitter 215.

Since a conversion from the common mode noise to the normal mode noise in the board-side coaxial connector 105 can be suppressed by a reciprocal theorem in electromagnetics, a reverse conversion from the normal mode noise to the common mode noise is also suppressed.

Therefore, similarly to the example of the first embodiment, in addition to that the noise resistance against the external noise can be expected to be improved, when a part of the transmission signal from the differential transmitter 215 passes through the connector 105, the part is converted into the common mode noise, and a phenomenon that causes unnecessary electromagnetic radiation can also be suppressed. Note that, the present sixth embodiment can also be applied to a case where the circuit board 103 transmits only the differential signals, that is, a case where the differential transmitter 215 is provided and the differential receiver 201 is not provided.

Other Embodiments

Note that, in the example of the present embodiment, the structure based on the example of the first embodiment has been described, but the structure may be combined with the structure of the example of the first embodiment to the fifth embodiment.

Although the embodiment has been described in detail, the embodiment is not limited to a specific embodiment, and various modifications and changes can be made within the scope described in the claims.

REFERENCE SIGNS LIST

- 101 electronic control device
- 102 camera
- 103 circuit board
- 104 coaxial cable
- 105 board-side coaxial connector
- 106 cable-side coaxial connector
- 107 non-coaxial cable
- 108 non-coaxial board-side connector
- 109 non-coaxial cable-side connector
- 110 cover
- 111 metal frame
- 201 differential receiver
- 202 signal wiring
- 203-1 coupling capacitor
- 203-2 coupling capacitor
- 204 termination resistor
- 205 connector ground connection
- 206 frame ground connection capacitor
- 211 common mode choke coil
- 212-1 adjustment resistor
- 212-2 adjustment resistor
- 213 transformer
- 214 low pass filter
- 215 differential transmitter
- 250 ground
- 251 signal ground (SG)
- 252 frame ground (FG)
- 305 IC
- 306 EMI gasket
- 307 signal input pin
- 308 n pin
- 309 wiring via hole
- 310 ground pattern connection via hole
- 311 connector ground pin
- 312 signal pin

The invention claimed is:

1. An electronic control device comprising:
   a circuit board configured to be provided in a frame and to have a communication circuit capable of receiving or transmitting differential signals via a pair of signal pins;
   a connector configured to be electrically connected to the circuit board and to input signals transmitted from an electronic device outside the frame by single-end transmission to the communication circuit; and
   a noise cancellation signal output circuit configured to output noise cancellation signals corresponding to noise superimposed on the signals in the connector, wherein
   one signal pin of the pair of signal pins of the communication circuit is connected to the connector, and the other signal pin is connected to the noise cancellation signal output circuit.

2. The electronic control device according to claim 1, wherein
   the noise cancellation signal output circuit is a common mode choke coil or a transformer,
   a primary side of the common mode choke coil or the transformer is connected between a signal ground connected to the connector and a frame ground connected to the frame, and
   a secondary side of the common mode choke coil or the transformer is connected to the other signal pin of the communication circuit.

3. The electronic control device according to claim 2, wherein
   the secondary side of the common mode choke coil or the transformer is connected to the other signal pin of the communication circuit via a voltage dividing resistor, and
   a resistance value of the voltage dividing resistor is adjusted such that a voltage of the noise cancellation signal input to the other signal pin cancels the noise.

4. The electronic control device according to claim 1, wherein
   the circuit board includes a plurality of the communication circuits,
   the connector includes a plurality of connector pins,
   the plurality of connector pins are connected respectively to the one signal pin of the different communication circuits, and
   the other signal pin of the plurality of communication circuits is commonly connected to the noise cancellation signal output circuit.

5. The electronic control device according to claim 2, wherein
   the transformer includes a wiring pattern on a substrate.

6. The electronic control device according to claim 1, wherein
   the noise cancellation signal output circuit includes a low pass filter.

7. The electronic control device according to claim 4, wherein
an adjustment resistor is inserted between the noise cancellation signal output circuit and the other signal pin of each of the plurality of communication circuits.

* * * * *